(12) United States Patent
Kemmerer

(10) Patent No.: US 10,405,091 B2
(45) Date of Patent: Sep. 3, 2019

(54) INPUT OF TIME DELAY VALUES TO SIGNAL PROCESSOR

(71) Applicant: Wavtech, LLC, Mesa, AZ (US)

(72) Inventor: Jason Kemmerer, Thousand Oaks, CA (US)

( * ) Notice: Subject to any disclaimer, the term of this patent is extended or adjusted under 35 U.S.C. 154(b) by 0 days.

(21) Appl. No.: 15/858,739

(22) Filed: Dec. 29, 2017

(65) Prior Publication Data
US 2018/0192188 A1    Jul. 5, 2018

Related U.S. Application Data

(60) Provisional application No. 62/442,055, filed on Jan. 4, 2017.

(51) Int. Cl.
*H03G 3/02* (2006.01)
*H04R 3/00* (2006.01)
*H04R 3/04* (2006.01)

(52) U.S. Cl.
CPC ............... *H04R 3/00* (2013.01); *H03G 3/02* (2013.01); *H04R 3/04* (2013.01); *H04R 3/007* (2013.01); *H04R 2201/028* (2013.01)

(58) Field of Classification Search
CPC . H04R 3/00; H04R 3/04; H04R 3/007; H04R 2201/028; H03G 3/02
See application file for complete search history.

(56) References Cited

U.S. PATENT DOCUMENTS

| | | | | |
|---|---|---|---|---|
| 3,445,773 A | * | 5/1969 | Thomas | G11C 27/026 327/285 |
| 3,809,812 A | * | 5/1974 | Smith, Sr. | G09B 19/00 369/47.23 |
| 3,857,059 A | * | 12/1974 | Larson | G01R 13/28 200/17 R |
| 4,090,032 A | * | 5/1978 | Schrader | H04R 3/005 381/108 |
| 4,486,832 A | * | 12/1984 | Haubner | G05B 19/07 700/14 |
| 4,714,915 A | * | 12/1987 | Hascal | G08B 21/182 324/433 |
| 4,733,100 A | * | 3/1988 | Nusairat | H02J 7/0032 307/10.7 |
| 4,843,368 A | * | 6/1989 | Poulos | B60Q 1/445 200/61.47 |
| 5,821,889 A | * | 10/1998 | Miller | H03M 1/185 341/139 |

(Continued)

*Primary Examiner* — Mohammad K Islam
(74) *Attorney, Agent, or Firm* — Stetina Brunda Garred & Brucker

(57) ABSTRACT

A signal processor delay input device with one or more signal inputs and one or more signal outputs includes a first multi-position switch and a second multi-position switch. A first value representative of an input state of the first multi-position switch corresponds to a first increment of a time delay applied to a signal that is being passed from a first one of the one or more signal inputs to a first one of the one or more signal outputs. A second value representative of an input state of the second multi-position switch corresponds to a second increment of the time delay applied to the signal being passed from the first one of the one or more signal inputs to the first one of the one or more signal outputs.

9 Claims, 10 Drawing Sheets

(56) References Cited

U.S. PATENT DOCUMENTS

| | | | | |
|---|---|---|---|---|
| 7,046,701 | B2* | 5/2006 | Mohseni | H04J 3/047 |
| | | | | 370/204 |
| 7,174,229 | B1* | 2/2007 | Chen | H04S 3/008 |
| | | | | 700/94 |
| 7,408,414 | B2* | 8/2008 | North | H03F 1/0244 |
| | | | | 330/251 |
| 7,538,455 | B2* | 5/2009 | Takami | G06F 1/26 |
| | | | | 307/140 |
| 7,560,984 | B2* | 7/2009 | Akizuki | H03C 5/00 |
| | | | | 330/136 |
| 7,834,673 | B2* | 11/2010 | Matsunami | H03K 7/08 |
| | | | | 327/276 |
| 9,397,646 | B2* | 7/2016 | Singh | H03K 5/13 |
| 9,673,793 | B2* | 6/2017 | Ma | H03K 5/12 |
| 9,871,530 | B1* | 1/2018 | La Grou | H03M 5/04 |
| 2006/0029237 | A1* | 2/2006 | Aikins | H03G 3/32 |
| | | | | 381/107 |
| 2011/0010750 | A1* | 1/2011 | Rodriguez | H03K 17/005 |
| | | | | 725/149 |
| 2013/0215804 | A1* | 8/2013 | Lu | H04W 56/00 |
| | | | | 370/280 |
| 2014/0098975 | A1* | 4/2014 | Doty | H03G 3/3005 |
| | | | | 381/104 |
| 2016/0197588 | A1* | 7/2016 | Olson | H03F 3/185 |
| | | | | 381/120 |
| 2016/0344401 | A1* | 11/2016 | La Grou | H03M 1/08 |
| 2017/0169807 | A1* | 6/2017 | Sato | G10H 1/42 |

* cited by examiner

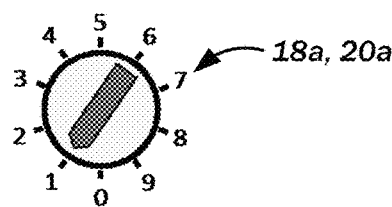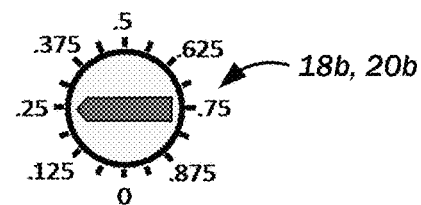
FIG. 2
FIG. 3

INPUT OF TIME DELAY VALUES TO SIGNAL PROCESSOR

CROSS-REFERENCE TO RELATED APPLICATIONS

The present application claims priority to U.S. Provisional Patent Application Ser. No. 62/442,055 entitled "Input of Time Delay Values to Signal Processor" filed Jan. 4, 2017, the disclosure of which is incorporated herein by reference.

STATEMENT RE: FEDERALLY SPONSORED RESEARCH/DEVELOPMENT

Not Applicable

BACKGROUND

1. Technical Field

The present disclosure relates to audio systems and input modalities therefor, and more particularly, to the input of time delay values to a signal processor.

2. Related Art

An audio system is comprised of several discrete but interconnected components that cooperate with each other to reproduce sound. As is well-understood in the art, waves of pressure changes in the air or other transmission medium is discerned as sound. This last segment of wave propagation is achieved with an acoustic transducer, also referred to as a loudspeaker, which converts electrical signals representative of the sound to corresponding physical movements of a diaphragm. The electrical signal of the sound may be stored as an analog waveform or a sequence of digital data representative thereof. In the case of digital audio, there may be a digital-to-analog converter (DAC) that processes the data, and generates analog voltage values corresponding to such data values for output to the loudspeaker. Digital audio may be stored in removable media such as compact discs (CDs), hard disk drives, and solid state memory devices, while analog audio may be stored on cassette tapes, vinyl records, and so forth.

Regardless of the source from which the electrical signals corresponding to the audio is generated, the component that generates such signals typically do not generate sufficient output power to drive the loudspeakers. To this end, most audio systems incorporate an audio power amplifier.

The audio signal may undergo additional processing prior to being output to the loudspeaker. One signal processing step is equalization, where the volume of discrete frequency ranges are increased or decreased so that the entire range of frequencies in the audio signal sounds balanced. In the most sophisticated audio systems, the equalizer may be used to fine-tune the volume of each instrument, which is understood to generate sound over specific frequency ranges. Other signal processors include limiters, compressors, noise gates, and expanders. Various effects may be applied to the audio signal as well, such as reverb, delay, pitch correction, distortion effects.

Because of binaural hearing, audio is recorded and reproduced in at least two channels—a left channel and a right channel. A loudspeaker positioned to the left side of the listener may receive the left channel audio, while another loudspeaker positioned to the right side of the listener may receive the right channel audio. In order to provide an even fuller listening experience, more channels that are connected to additional loudspeakers that are positioned in corresponding locations to the listener may be provided.

Almost all modern automobiles are equipped with audio systems, by which various entertainment and information content may be presented to the driver and the passengers. Such audio systems are pre-installed by the automobile manufacturer, and may be referred to as stock or OEM (original equipment manufacturer) components. In vehicle installations, loudspeakers are mounted in various locations throughout its interior, and like home installations, are connected to left channel audio outputs and right channel audio outputs, among other possible channels. Furthermore, a given speaker design may have a limited frequency response that does not span the entirety of the audible frequency range, so different types of loudspeakers, from tweeters, mid-range drivers, and subwoofers may be installed. With stock/OEM systems, the enclosures for the loudspeakers are built directly into the interior vehicle panels. The radiating element of the loudspeaker may be protected with a grille that is likewise integral with the vehicle interior, and may be surrounded by dampening material to minimize excess vibration.

In order to mitigate the effects of a poorly imaged soundstage, and/or to reduce phasing-based losses of bass frequency components in the audio, a delay audio processor may be utilized. Typically, such delay audio processors include one or more input modalities by which the delay factor applied to each channel can be adjusted. The specific delay value may be shown on a display screen for the installer or user to confirm that the desired value has been set. Alternatively, the delay may be programmed via a remote computer system that is connected to the delay audio processor. However, each of these solutions have proven to be expensive, and require a non-volatile memory device to retain the most recent delay values. Accordingly, there is a need in the art for an improved signal processor delay input device.

SUMMARY

One embodiment of the present disclosure is directed to a signal processor delay input device with one or more signal inputs and one or more signal outputs. There may be a first multi-position switch and a second multi-position switch. A first value representative of an input state of the first multi-position switch may correspond to a first increment of a time delay that can be applied to a signal that is being passed from a first one of the one or more signal inputs to a first one of the one or more signal outputs. A second value representative of an input state of the second multi-position switch may correspond to a second increment of the time delay that can be applied to the signal being passed from the first one of the one or more signal inputs to the first one of the one or more signal outputs.

According to another aspect, there may be a third multi-position switch and a fourth multi-position switch. A third value representative of an input state of the third multi-position switch may correspond to a third increment of a time delay that can be applied to a signal being passed from a second one of the one or more signal inputs to a second one of the one or more signal outputs. Furthermore, a fourth value representative of an input state of the fourth multi-position switch may correspond to a fourth increment of the time delay that can be applied to the signal being passed from the second one of the one or more signal inputs to the second one of the one or more signal outputs.

According to another embodiment of the present disclosure, there may be a signal processor delay input device that includes inputs and outputs for a first audio channel and a second audio channel. There may be a first pair of rotary multi-position switches for the first audio channel, and a second pair of rotary multi-position switches for the second audio channel. Additionally, the signal processor delay input device may include a signal processor integrated circuit that can be connected to the inputs for the first audio channel, inputs for the second audio channel, outputs for the first audio channel, outputs for the second audio channel, and the first and second pair of rotary multi-position switches. A first set of values representative of input states of the first pair of rotary multi-position switches may correspond to a first audio channel delay that can be applied to first audio channel input signals received from the inputs and passed to the outputs. A second set of values representative of input states of the second pair of rotary multi-position switches may correspond to a second audio channel delay that can be applied to the second audio channel input signals received from the inputs and passed to the outputs.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 2 shows an interface of a first type rotary switch that may be utilized in the first embodiment of the input device, along with a table of the different values output therefrom in each position;

FIG. 3 shows an interface of a second type rotary switch that may be utilized in the first embodiment of the input device, along with a table of the different values output therefrom in each position;

DETAILED DESCRIPTION

The detailed description set forth below in connection with the appended drawings is intended as a description of the presently preferred embodiments of an input device for setting time delay values for an audio signal processor, and is not intended to represent the only form in which the presented embodiments may be developed or utilized. It is further understood that the use of relational terms such as first and second and the like are used solely to distinguish one from another entity without necessarily requiring or implying any actual such relationship or order between such entities.

Figure 1A:
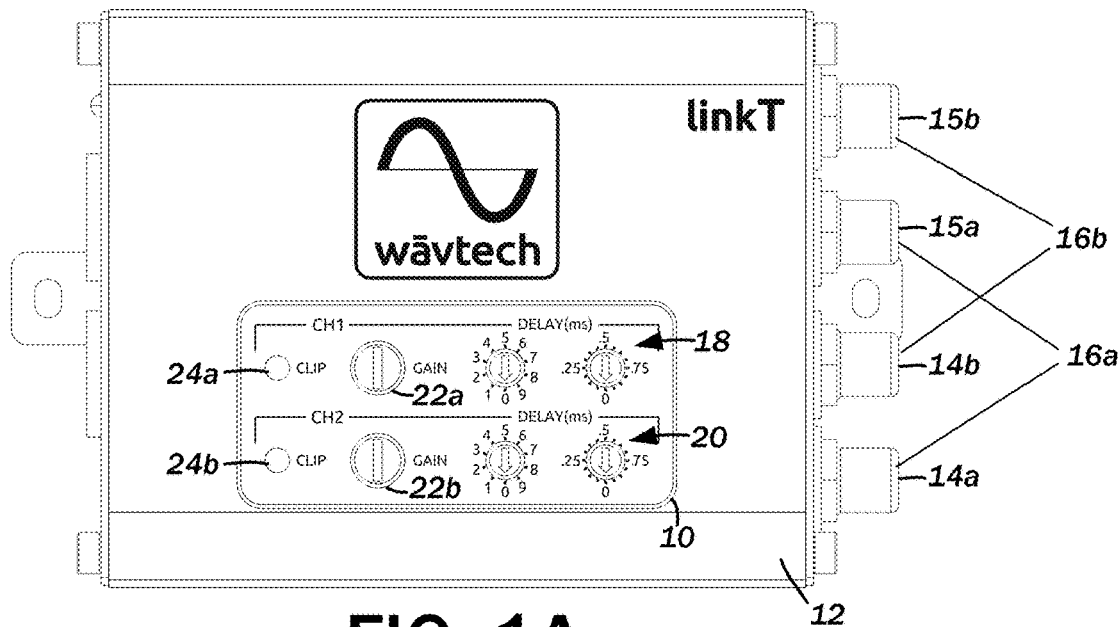
FIGS. 1A-1C illustrate an exemplary audio delay processor including an input device in accordance with a first embodiment of the present disclosure.
Figure 1B:
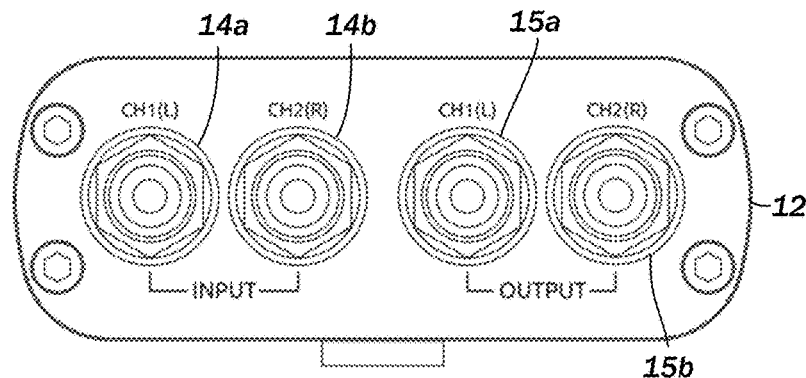

With reference to FIG. 1A, various embodiments of the present disclosure contemplate an input device 10 that may cooperatively function with an audio signal processor 12 that is part of a vehicle or home audio system. The audio signal processor 12 may be connected to a signal source, which may output two or more audio signal lines, e.g., a left audio signal line and a right audio signal line. As shown in FIG. 1B, a front panel of the audio signal processor 12 includes a first input terminal 14a and a second input terminal 14b to which the left audio signal line and the right audio signal line may be coupled. In this regard, the first input terminal 14a corresponds to a left audio channel 16a, and the second input terminal 14b corresponds to a right audio channel 16b. The incoming audio signal may be processed by an onboard digital signal processor (DSP) of the audio signal processor 12 to apply a delay, apply signal level limits, compress the signal, and so forth, and pass the processed signal to an audio amplifier, which in turn may be connected to one or more amplifier channels and corresponding loudspeakers. To this end, the audio signal processor 12 may also include a first output terminal 15a, and a second output terminal 15b. The first output terminal 15a corresponds to a left audio channel 16a, and the second output terminal 15b corresponds to a right audio channel 16b. In the illustrated embodiment, the input and output terminals 14, 15 may be RCA (Radio Corporation of America) connectors, though any other suitable electrical interconnection modality may be substituted.

Figure 1C:
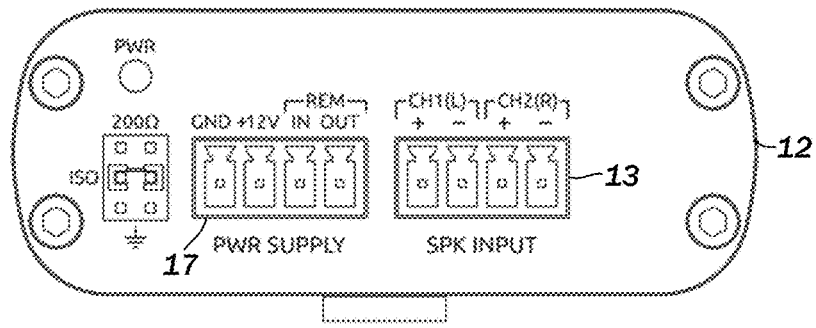

As illustrated in FIG. 1C, in addition the line level inputs that may be provided via the input terminals 14, speaker level inputs may be provided via a terminal block 13. It will be recognized that speaker signals are comprised of a positive (+) connection and a negative (−) connection, and so there may be a pair of terminals for the left and right channels. The rear panel of the audio signal processor may also include a power supply terminal block 17, which includes a ground connection and a positive supply voltage connection. Additionally, the power supply terminal block may include a remote trigger input terminal as well as a remote trigger output terminal.

The input device 10 of the present disclosure is understood to include a first set of multi-position rotary switches 18 for adjusting the time delay of audio signals of the first channel 16a, and a second set of multi-position rotary switches 20 for adjusting the time delay of audio signals of the second channel 16b. Although not considered part of the input device 10, the audio signal processor 12 may also include a gain level knob 22, a first one 22a being for the first channel 16a and a second one 22b being for the second channel 16b. Optionally, there may be a clipping indicator light 24, with a first one 24a being for the first channel 16a and a second one 24b being for the second channel 16b. The clipping indicator light 24 is understood to be illuminated when the gain level is increased to such an extent that the output audio signal is at a maximum and begins to clip against the internal voltage rails of the audio signal processor 12. Although depicted as being integral with the audio signal processor 12, the switches 18, 20 may be separately provided and connected as described below with an interconnect cable, via wireless communications modalities such as radio frequency, infrared, and the like.

With additional reference to FIG. 2, in one embodiment, the first set of multi-position rotary switches 18 includes a first switch 18a and a second switch 18b. Along these lines, the second set of multi-position rotary switches 20 includes a first switch 20a and a second switch 20b.

The first switch 18a of the first set and the first switch 20a of the second set are both a ten-position rotary switch, the dial for which may be discretely set to any one of positions 0 to 9. When set to a particular position, the first switches 18a, 20a effectively correspond to a four-digit binary value from "0000" (dec 0), "0001" (dec 1), "0010" (dec 2), "0011" (dec 3), "0100" (dec. 4), "0101" (dec 5), "0110" (dec 6), "0111" (dec 7), "1000" (dec 8), and "1001" (dec 9). The table of FIG. 2 illustrates the various positions to which the first switch 18a, 20a may be set, and the corresponding states of the pins of the switches 18, 20.

The second switch 18b of the first set and the second switch 20b of the second set are both a sixteen-position rotary switch, the dial for which may be discretely set to any one of positions 0 to 15 (and hexadecimal F). The range of 4-bit values that may be represented include "0000" (hex/dec 0), "0001" (hex/dec 1), "0010" (hex/dec 2), "0011" (hex/dec 3), "0100" (hex/dec 4), "0101" (hex/dec 5), "0110" (hex/dec 6), "0111" (hex/dec 7), "1000" (hex/dec 8), "1001" (hex/dec 9), "1010" (hex A/dec 10), "1011" (hex B/dec 11), "1100" (hex C/dec 12), "1101" (hex D/dec 13), "1110" (hex E/dec 14), and "1111" hex F/dec 15). The table of FIG. 3 illustrates the various positions to which the second switch 18b, 20b may be set, and the corresponding states of the pins of the switches 18, 20. Although the foregoing makes reference to 4-digit binary numbers, hexadecimal numbers, and decimal numbers, it is to be understood that the switches 18, 20 do not generate binary, hexadecimal, or decimal data values that may be processed by a data processor.

Figure 4A:
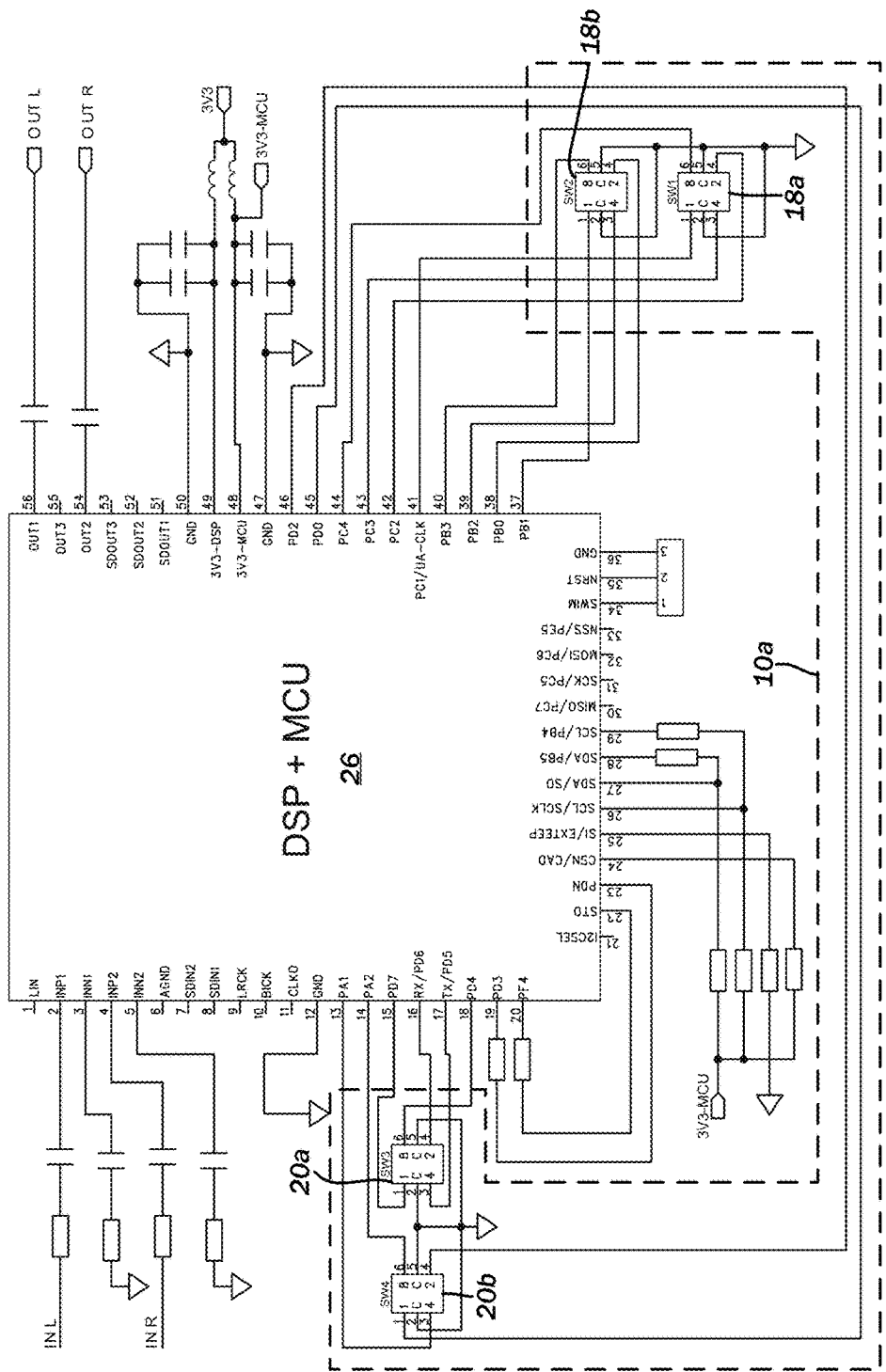
FIG. 4A is a schematic diagram showing the first embodiment of the input device connected to a digital signal processor (DSP)

Referring additionally to the schematic diagram of FIG. 4A, according to various embodiments, the multi-position rotary switches 18, 20 each have a plurality of input terminals identified as bits 1, 2, 4 and 8. Bit 1 corresponds to a first pin 1, Bit 2 corresponds to a fourth pin 4, Bit 4 corresponds to a third pin 3, and Bit 8 corresponds to a sixth pin 6. In the illustrated example, the most significant bit corresponds to pin 6, the next lesser significant bit corresponds to pin 3, the next lesser significant bit corresponds to pin 4, and the least significant bit corresponds to pin 1. In FIG. 4A, the "C" or common pins of each of the multi-position rotary switches 18, 20 are connected to ground, while the pins corresponding to bits 1, 2, 4 and 8 are connected to separate general purpose input/output lines of the DSP 26. The 4-bit state of the corresponding pins of each of the rotary switches are provided as digital low signals interpreted by the connected data processor as the switch position corresponding to the tables of FIG. 2 and FIG. 3.

The specific connections between the pins of the switches 18, 20, and the input ports of the DSP 26 may be varied, as the software being executed by the DSP 26 may be configured to interpret the inputs accordingly. In the first embodiment, the first switch 18a, and the pins corresponding to bits 1, 2, 4, and 8, may be connected to input ports PC1, PC2, PC3, and PC4, respectively. The second switch 18b and the pins corresponding to bits 1, 2, 4, and 8, may be connected to input ports PB1, PB0, PB2, and PB3, respectively. The first switch 20a and the pins corresponding to bits 1, 2, 4, and 8 may be connected to input ports PD7, PD6, PD5, and PD4, respectively. The second switch 20b and the pins corresponding to bits 1, 2, 4, and 8 may be connected to input ports PD0, PD2, PA1, and PA2, respectively.

Figure 4B:
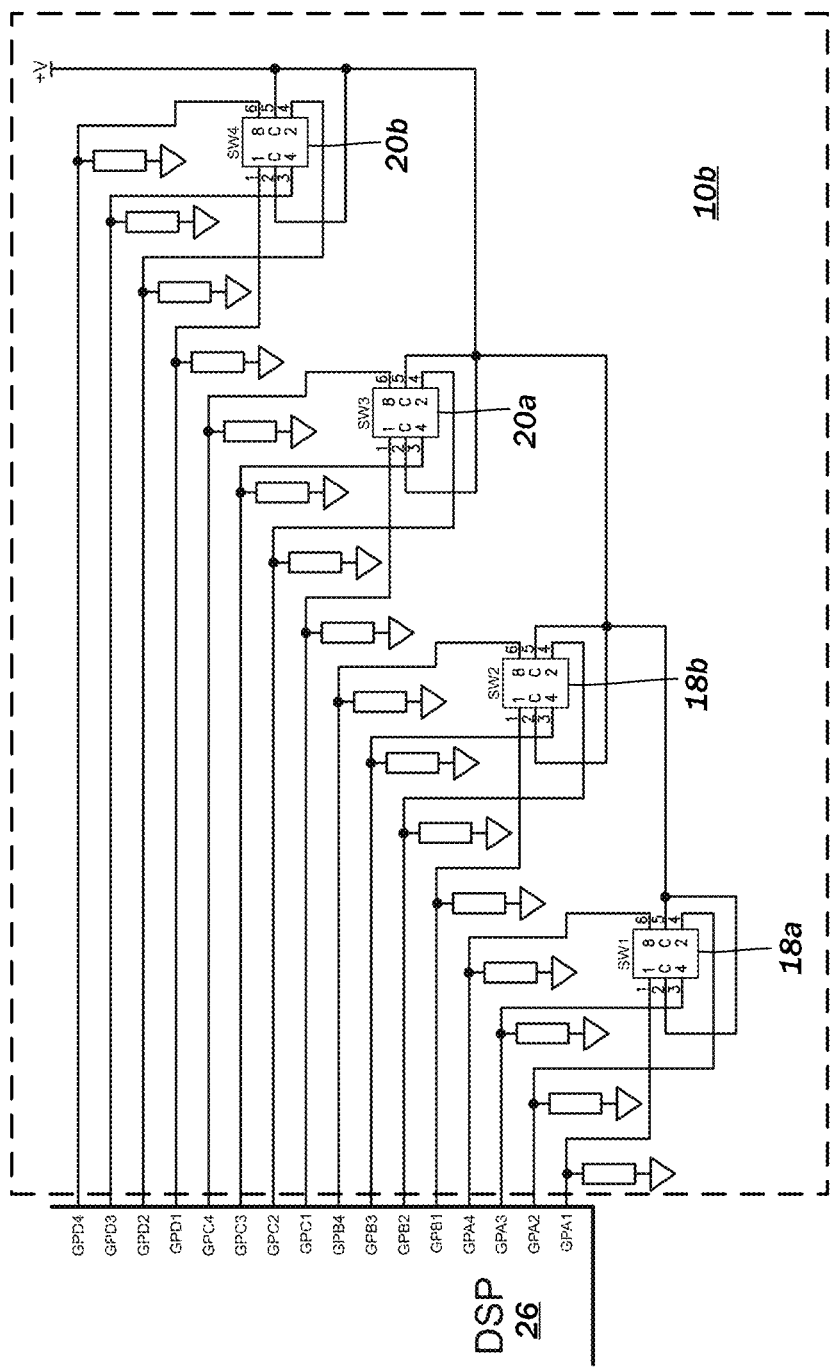
FIG. 4B is a schematic diagram showing a second embodiment of the input device.

FIG. 4B illustrates a second embodiment of the input device 10b, which involves a direct connection of the switch terminals to the input ports of the DSP 26. Thus, a set of four input ports are connected to each of the switches 18, 20. As shown, the first switch 18a, and the pins corresponding to bits 1, 2, 4, and 8 may be connected to input ports GPA1, GPA2, GPA3, and GPA4, respectively. The second switch 18b, and the pins corresponding to bits 1, 2, 4, and 8 may be connected to input ports GPB1, GPB2, GPB3, and GPB4, respectively. The first switch 20a, and the pins corresponding to bits 1, 2, 4, and 8 may be connected to input ports GPC1, GPC2, GPC3, and GPC4, respectively. The second switch 20b, and the pins corresponding to bits 1, 2, 4, and 8 are connected to input ports GPD1, GPD2, GPD3, and GPD4, respectively. The "C" or common pins of each of the multi-position rotary switches 18, 20 in this embodiment are connected to a positive voltage, while the pins corresponding to bits 1, 2, 4 and 8 are connected to separate general purpose input/output lines of the DSP 26. The 4-bit state of the corresponding pins of each of the rotary switches are provided as digital high signals. It will be appreciated that the order of connecting the pins of the switches 18, 20 to the DSP 26 are exemplary only, and any other pin connection configuration may be utilized.

In accordance with one embodiment, the first switches 18a, 20a correspond to a first digit representative of the number of milliseconds of delay, with each detent or position corresponding to one millisecond. Furthermore, the second switches 18b, 20b correspond to a second digit representative of a fraction of milliseconds of delay. Each detent or position is understood to correspond to 0.0625 milliseconds of delay, and there are sixteen positions each with successively increasing fractions of milliseconds. Every second multiple is imprinted or otherwise indicated on the switches 18b, 20b, starting at 0.0 milliseconds, followed by 0.125 milliseconds, 0.25 milliseconds, 0.375 milliseconds, 0.5 milliseconds, 0.625 milliseconds, 0.75 milliseconds, and 0.875 milliseconds. The fractional breakdown of each detent/position of the switches 18b, 20b is presented by way of example only and not of limitation, and any other fractional amount may be substituted without departing from the scope of the present disclosure.

The value from the first switch 18a is added with the value from the second switch 18b to yield a total delay time for the first channel 16a. Along these lines, the value from the first switch 20a is added to the value from the second switch 20b to yield a total delay time for the second channel 16b. The DSP 26 is understood to calculate these values and apply the delay corresponding to the inputted values. While reference has been made to adjusting a time delay, and each switch increment representing a unit, fraction, and/or increment of time, this is by way of example only. In alternative embodiments, it is also possible to utilize input device 10 for different values in other contexts such as audio equalizers. Octaves, frequency bands, specific frequencies, as well as decibel values can be set via the input device 10, with each position representing an increment thereof.

Figure 5:
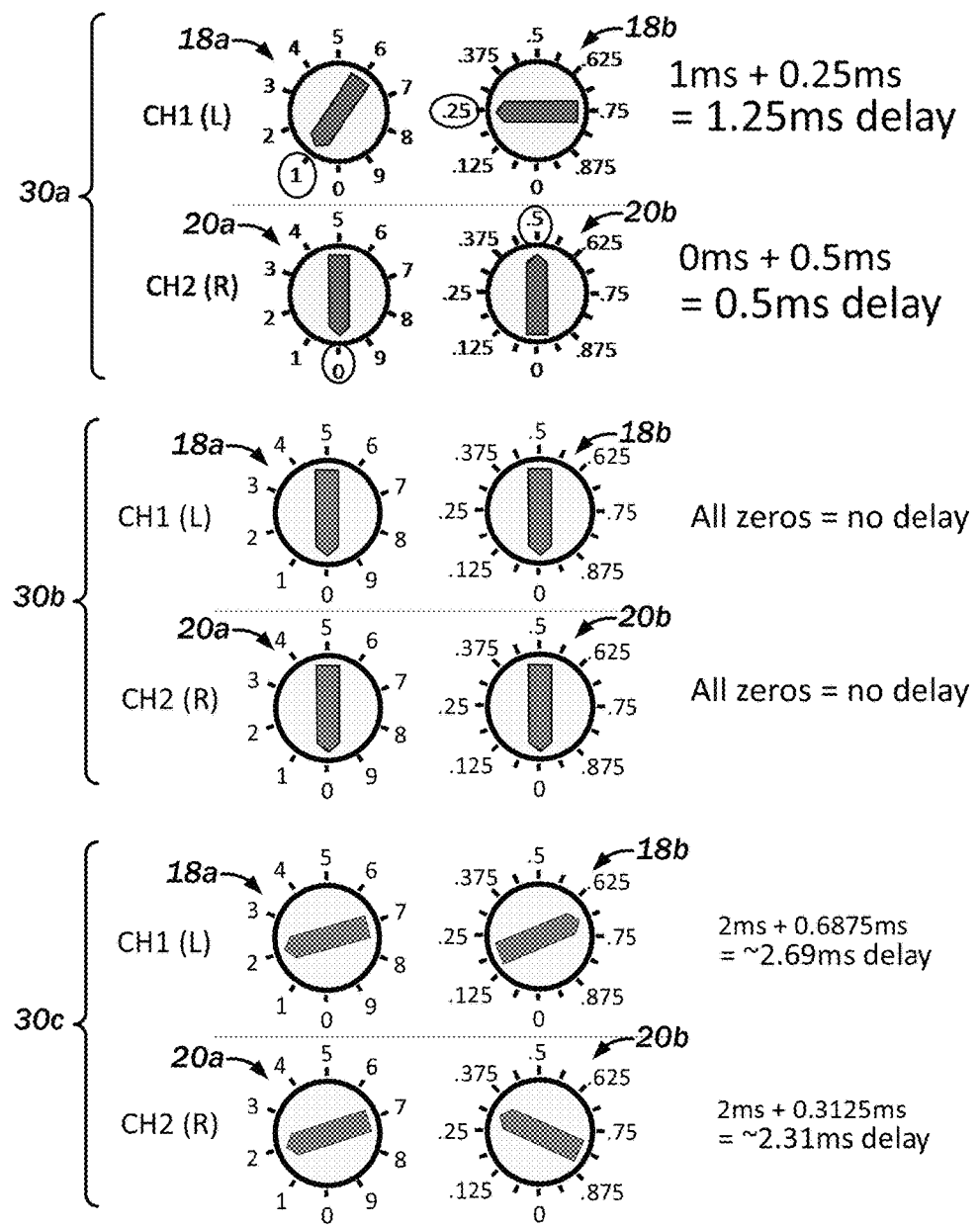
FIG. 5 is chart illustrating the various rotary switch positions of the first embodiment of the input device and the corresponding delay values set thereby.

FIG. 5 illustrates a series of switch positions and the corresponding delay values therefor. In a first example 30a, the first switch 18a is set to the first position, representative of 1 millisecond of delay. The second switch 18b is set to the fifth position, representative of 0.25 milliseconds of delay. This is understood to yield a total delay of 1.25 milliseconds for the first channel 16a. The first switch 20a (for the second channel 16b) is set to zero, for 0 milliseconds of delay, while the second switch 20b is set to the eighth position representative of 0.5 milliseconds of delay. The value from the two switches 20a, 20b are combined for a total delay of 0.5 milliseconds of delay for the second channel 16b.

In a second example 30b, all of the switches 18a, 18b, 20a, and 20b are set to zero for zero seconds of delay for both the first channel 16a and the second channel 16b.

In a third example 30c the first switch 18a is set to the third position, representative of 2 millisecond of delay. The second switch 18b is set to the eleventh position, representative of 0.6875 milliseconds of delay. This is understood to yield a total delay of 2.6875 milliseconds or rounded to approximately 2.69 milliseconds of delay for the first channel 16a. The first switch 20a is set also set to the third position, for 2 milliseconds of delay, and the second switch 20b is set to the sixth position representative of 0.3125 milliseconds of delay. The value from the two switches 20a, 20b are combined for a total delay of 2.3125 milliseconds or rounded to approximately 2.31 milliseconds of delay for the second channel 16b.

In the first embodiment of the input device 10 as detailed in FIG. 4A involved the use of sixteen total input/output ports of the DSP 26 (one clock output and one value input for each of the switches 18a, 18b, 20a, and 20b), whereas the second embodiment as detailed in FIG. 4B involved the use of 8 total input/output ports. Various alternative configurations are also contemplated, however.

Figure 6:
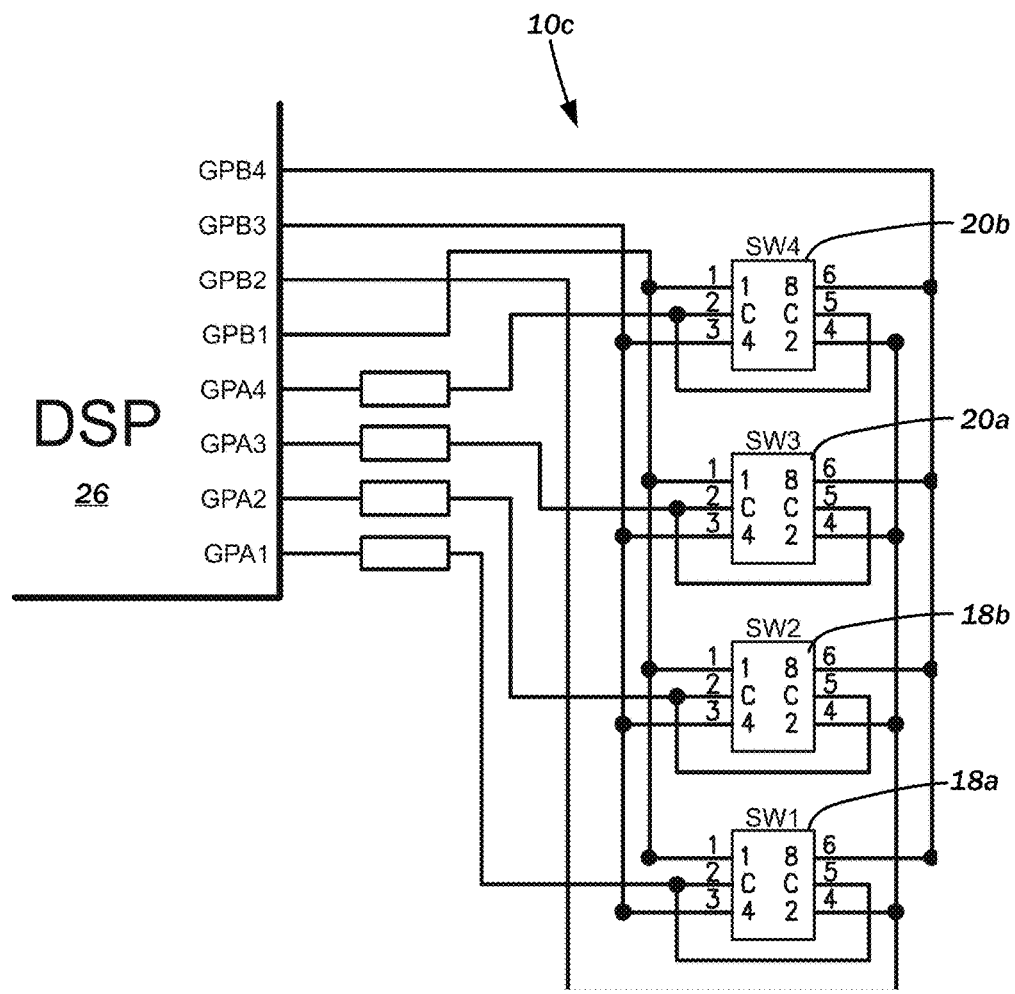
FIG. 6 is a schematic diagram of a third embodiment of the input device connected to the DSP in which each of the bits of the rotary switch output are connected to an input line of the DSP.
Figure 7A:
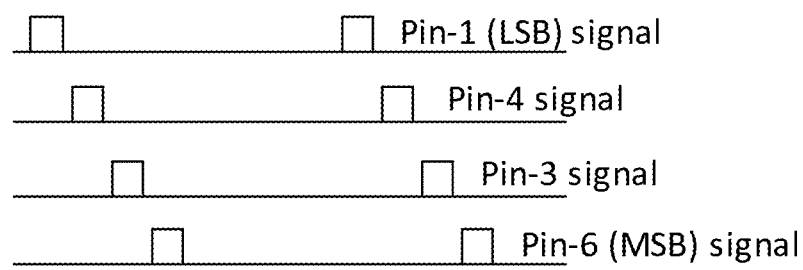
FIG. 7A is a graph showing example input pulses to the rotary switch to generate output signals representative of switch position.

In another example illustrated in FIG. 6, only eight input/output ports are available for four switches in a third embodiment 10c. Different pulsed clock signals as shown in FIG. 7A may be applied to pins 1, 4, 3, and 6, respectively, which may be generated by the digital signal processor (DSP) 26 and output from a first set of general purpose input/output lines PC1, PC2, PC3, and PC4, respectively. In FIG. 6 the "C" or common pins of each of the multi-position rotary switches 18, 20 are connected to separate general purpose input/output lines PB0, PB1, PB2, and PB3 of the DSP 26. Specifically, PB0 is connected to the C pins of the first switch 18a, PB1 is connected to the C pins of the second switch 18b, PB2 is connected to the C pins of the first switch 20a, and PB3 is connected to the C pins of the second switch 20b. This pinout configuration is presented by way of example only and not of limitation, and any other suitable pin connection may be readily substituted without departing from the scope of the present disclosure.

Figure 7B:
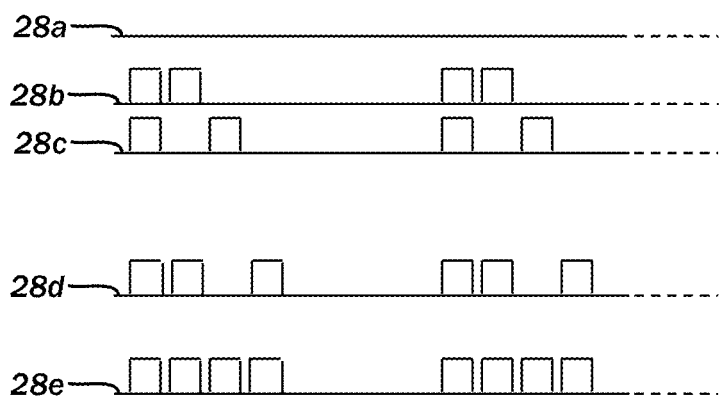
FIG. 7B is a graph showing example output pulses from the rotary switch generated in response to the input pulses provided thereto.

FIG. 7B illustrates a series of exemplary output signals that are generated by the switches 18, 20 in response to the clock input signals for the configuration of FIG. 6. For purposes of the following examples, reference will be made to a single switch 20b, though it will be appreciated that the examples are applicable to any other switch 18a, 18b, or 20a. Furthermore, although the outputs of only a selected input positions of the switch are shown, those having ordinary skill in the art will be able to readily ascertain the other pulsed output signals for different switch positions. A first plot 28a illustrates the output from the common pin with the switch 20b set to the "0" position, with no "high" or "1" portion. A second plot 28b illustrates the output with the switch 20b set to a third position corresponding to a binary value of "0011" or hexadecimal/decimal 3. The least significant bits are generated first in the illustrated example. A third plot 28c illustrates the output with the switch 20b set to a fifth position corresponding to a binary value of "0101" or hexadecimal/decimal 5. A fourth plot 28d illustrates the output with the switch 20b set to an eleventh position corresponding to a binary value of "1101" or hexadecimal B/decimal 11. Finally, a fifth plot 28e illustrates the output with the switch 20b set to a fifteenth position corresponding to a binary value of "1111" or hexadecimal F/decimal 15.

Figure 8:
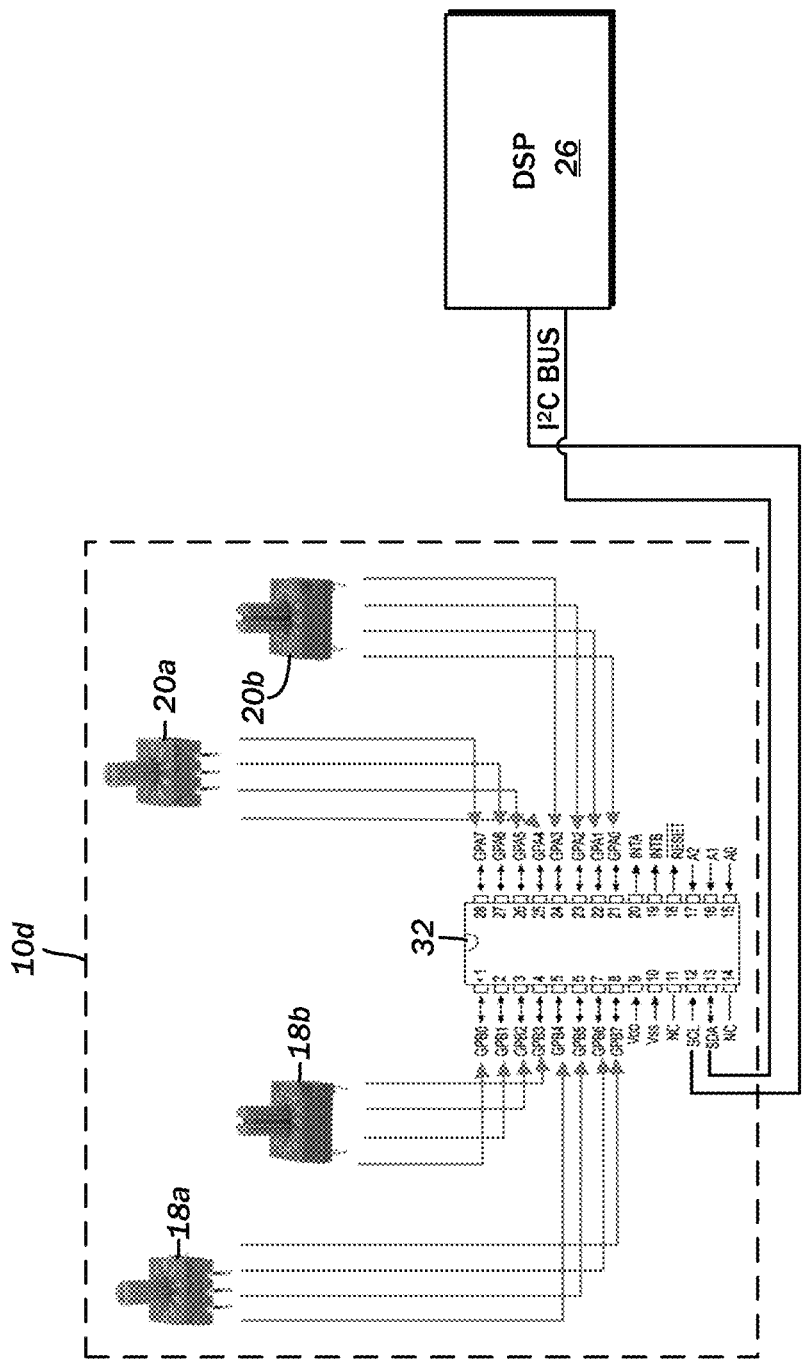
FIG. 8 is a schematic diagram of a fourth embodiment of the input device connected to the DSP in which the rotary switch outputs are connected to a input/output expander that generates a signal over a single serial line in response to the switch outputs.

FIG. 8 illustrates a fourth embodiment of the input device 10d that utilizes a 16-bit input/output expander 32. Each of the four pins corresponding to bits 1, 2, 4, and 8 of the switches 18a, 18b, 20a, and 20b are connected to the input lines of the input/output expander 32, which generates corresponding output signals representative of each of the values. In one exemplary embodiment, the output from the input/output expander 32 may be transmitted via an I$^2$C bus.

Figure 9:
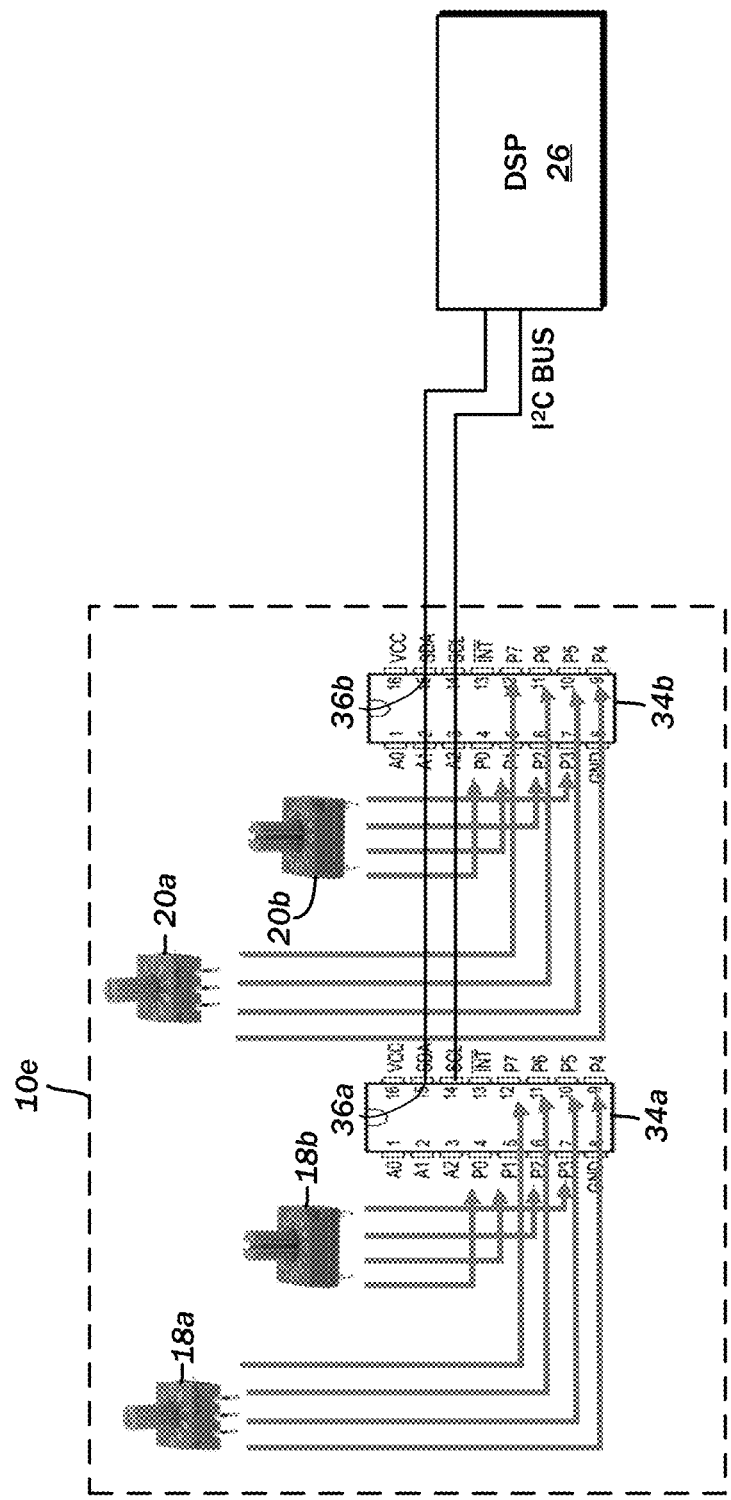
FIG. 9 is a schematic diagram of a fifth embodiment of the input device connected to the DSP in which a first set of the rotary switch outputs are connected to a first I/O expander that generates a signal over a single serial line, and a second set of rotary switch outputs are connected to a second I/O expander that likewise generates a signal over a single serial line.

FIG. 9 depicts a fifth embodiment of the input device 10e utilizing a pair of 8-bit input/output expanders 34a and 34b. Each of the channels 16 is handled by one input/output expander 34, with each of the four pins corresponding to bits 1, 2, 4, an 8 of the first switch 18a and the second switch 18b for the first channel 16a being connected to the first 8-bit input/output expander 34a, and each of the four pins corresponding to bits 1, 2, 4, an 8 of the first switch 20a and the second switch 20b for the second channel 16b being connected to the second 8-bit input/output expander 34b. Both the first and the second 8-bit input/output expander 34a, 34b include a respective serial output line 36a, 36b that are connected to the DSP 26 over an I$^2$C bus.

In either the fourth embodiment 10d or the fifth embodiment 10e, the respective input/output expanders 32, 34 are specifically configured for use as I$^2$C bus nodes and accordingly have SCL (clock) and SDA (data) lines conforming to I$^2$C standards. The DSP 26 is likewise understood to include I$^2$C bus functionality, including SCL and SDA ports.

Figure 10:
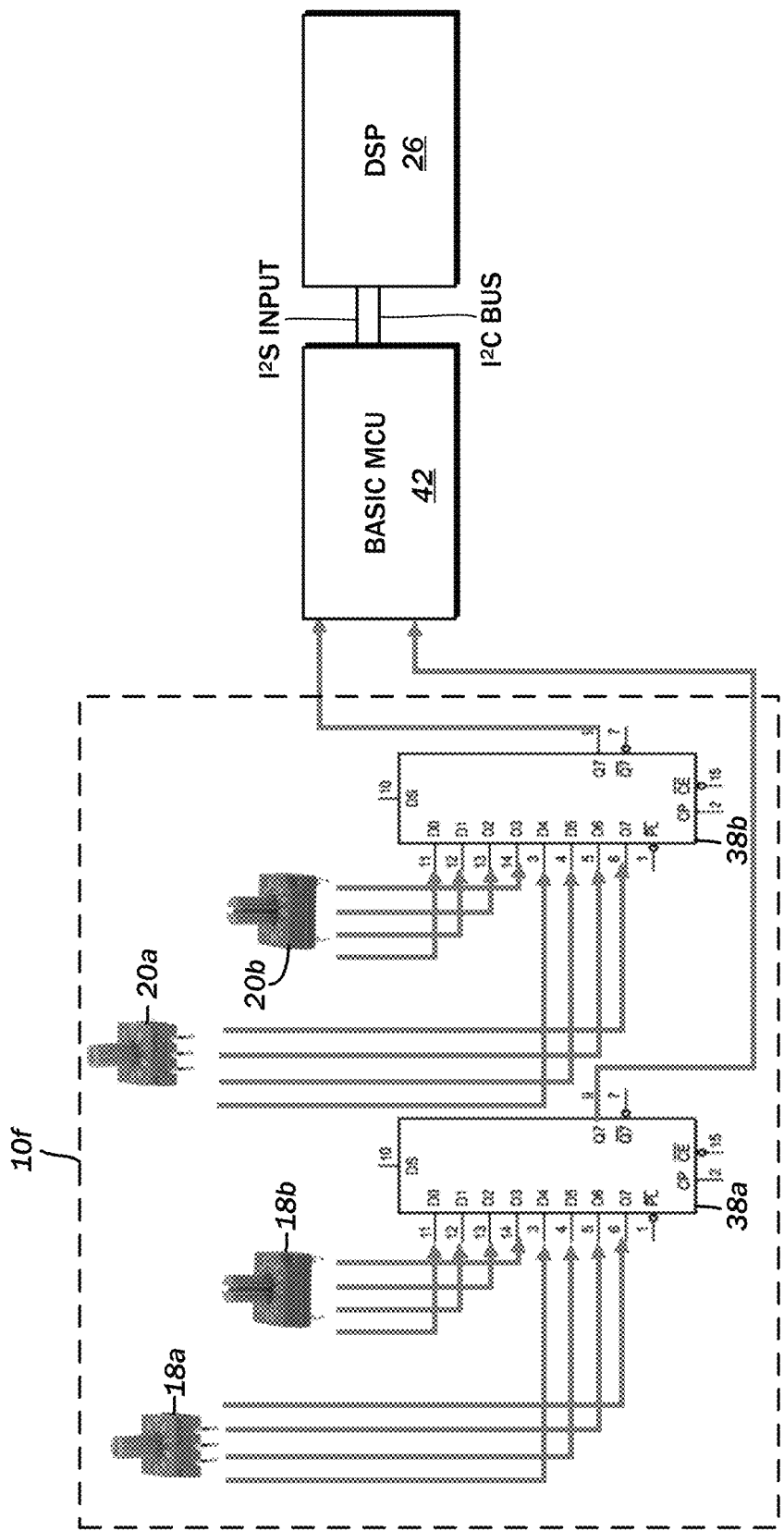
FIG. 10 is a schematic diagram of a sixth embodiment of the input device connected to the DSP in which different sets of the rotary switch outputs are connected to respective parallel-in, serial-out shift registers and then combined with a microcontroller.

FIG. 10 depicts a sixth embodiment of the input device 10f that utilizes two 8-bit parallel-in/serial out shift registers 38a, 38b. The first switch 18a and the second switch 18b for the first channel 16a are connected to the parallel inputs of the first shift register 38a, while the first switch 20a and the second switch 20b for the second channel 16b are connected to the parallel inputs of the second shift register 38b. The respective serial outputs 40a, 40b of the first and second shift registers 38a, 38b are connected to a microcontroller 42, which selectively generates signals to the DSP 26 that correspond to the switch values. In one embodiment, the microcontroller 42 may communicate with the DSP 26 over the I$^2$C bus. Alternatively, the microcontroller 42 may communicate with the DSP 26 via an I$^2$S input.

The particulars shown herein are by way of example and for purposes of illustrative discussion of the embodiments of the disclosure only and are presented in the cause of providing what is believed to be the most useful and readily understood description of the principles and conceptual aspects. In this regard, no attempt is made to show details with more particularity than is necessary for the fundamental understanding of the present disclosure, the description taken with the drawings making apparent to those skilled in the art how the several forms of the present disclosure may be embodied in practice.

What is claimed is:

1. A signal processor delay input device including inputs and outputs for a first audio channel connectible to a first loudspeaker at a first location and a second audio channel connectible to a second loudspeaker at a second location separated from the first location, the signal processor delay input device, comprising:
   first and second primary increment multi-position switches, first values representative of a respective input state of the primary increment multi-position switches corresponding to primary time delay increments; and
   first and second secondary increment multi-position switches, second values representative of a respective input state of the secondary increment multi-position switches corresponding to secondary time delay increments fractional to the first time delay increments;
   a signal processor integrated circuit connected to the inputs for the first audio channel, inputs for the second audio channel, outputs for the first audio channel, outputs for the second audio channel, the first and second primary increment multi-position switches, the first and second secondary increment multi-position switches, a first set of values representative of the input states of the first primary increment multi-position switch and the first secondary increment multi-position switch added together corresponding to a first audio channel delay applied to first audio channel input signals received from the inputs and passed to the outputs, and a second set of values representative of the input states of the second primary increment multi-position switch and the second secondary increment multi-position switch added together corresponding to a second audio channel delay applied to the second audio channel input signals received from the inputs and passed to the outputs, the first audio channel delay and the second audio channel delay being independently tunable to compensate for the separated first location of the first loudspeaker and the second location of the second loudspeaker for audio generated therefrom to concurrently reach a listener location.

2. The signal processor delay input device of claim 1, further comprising:
   first and second gain level input devices, gain level values representative of respective input states of the gain level input devices corresponding to gain factors of amplifications applied to the signal being passed from the input of the first audio channel to the output of the first audio channel, and the signal being passed from the input of the second audio channel to the output of the second audio channel.

3. The signal processor delay input device of claim 2, further comprising:
   a clipping indicator light activated in response to an output signal generated from the one or more signal outputs exceeding a clipping threshold.

4. The signal processor delay input device of claim 1, wherein the first and second primary increment multi-position switches are rotary switches.

5. The signal processor delay input device of claim 1, wherein the first and second secondary increment multi-position switches are rotary switches.

6. The signal processor delay input device of claim 1, wherein the first and second primary increment multi-position switches ten positions, with the primary time delay increment being one millisecond.

7. The signal processor delay input device of claim 1, wherein the first and second secondary increment multi-position switches have sixteen positions, with the secondary time delay increment being 0.0625 milliseconds.

8. The signal processor delay input device of claim 1, wherein the first and second primary increment multi-position switches and the first and second secondary increment multi-position switch are each connected to individual input ports of the signal processor integrated circuit.

9. The signal processor delay input device of claim 1, wherein a first clock signal is applied to an output from the primary increment multi-position switches, and a second clock signal different from the first clock signal is applied to and output from the secondary increment multi-position switches.

* * * * *